United States Patent
Zhou et al.

(10) Patent No.: US 8,530,929 B2
(45) Date of Patent: Sep. 10, 2013

(54) MELT-PROCESSABLE, INJECTION-MOLDABLE THERMOPLASTIC POLYMER COMPOSITION AND SEMI-CONDUCTIVE DEVICES FABRICATED THEREWITH

(75) Inventors: Weijun Zhou, Lake Jackson, TX (US); Brian Chen, Taipei (TW); Patricia Ansems, Lake Jackson, TX (US); Stephen F. Hahn, Midland, MI (US)

(73) Assignee: Dow Global Technologies, LLC, Midland, MI (US)

( * ) Notice: Subject to any disclaimer, the term of this patent is extended or adjusted under 35 U.S.C. 154(b) by 383 days.

(21) Appl. No.: 13/056,683

(22) PCT Filed: Jul. 31, 2009

(86) PCT No.: PCT/US2009/052340
§ 371 (c)(1),
(2), (4) Date: Jan. 31, 2011

(87) PCT Pub. No.: WO2010/025004
PCT Pub. Date: Mar. 4, 2010

(65) Prior Publication Data
US 2011/0133245 A1    Jun. 9, 2011

Related U.S. Application Data

(60) Provisional application No. 61/091,484, filed on Aug. 25, 2008.

(51) Int. Cl.
*H01L 33/56* (2010.01)
*C08G 63/91* (2006.01)

(52) U.S. Cl.
USPC ............... 257/100; 257/788; 257/E33.059; 525/55

(58) Field of Classification Search
USPC ............... 257/100, 788, E33.059; 525/55
See application file for complete search history.

(56) References Cited

U.S. PATENT DOCUMENTS

| | | | | |
|---|---|---|---|---|
| 5,475,040 A | * | 12/1995 | Jamison et al. | 523/513 |
| 6,326,237 B1 | * | 12/2001 | Carter et al. | 438/108 |

* cited by examiner

*Primary Examiner* — Evan Pert
(74) *Attorney, Agent, or Firm* — Muncy, Geissler, Olds & Lowe, PLLC

(57) ABSTRACT

A thermoplastic, hydrogenated vinyl aromatic/conjugated diene block polymer composition, especially a hydrogenated styrene/butadiene triblock composition, functions well as a LED encapsulating material in that it provides one or more of optical clarity, thermal stability, ultraviolet light resistance, melt-processability and injection-moldability. The resulting LED resists deformation after setting or hardening under typical solder reflow conditions.

6 Claims, 1 Drawing Sheet

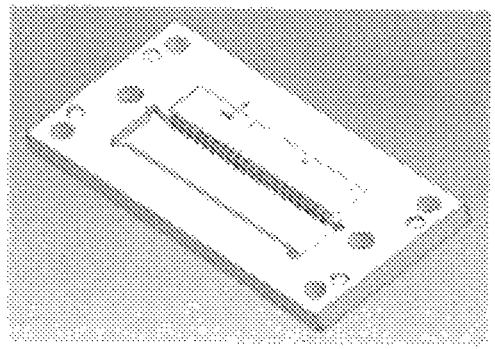

ated by an optically clear and thermally stable material into
MELT-PROCESSABLE, INJECTION-MOLDABLE THERMOPLASTIC POLYMER COMPOSITION AND SEMI-CONDUCTIVE DEVICES FABRICATED THEREWITH This application is a non-provisional application claiming priority from the U.S. Provisional Patent Application No. 61/091,484, filed on Aug. 25, 2008, entitled "MELT-PROCESSABLE, INJECTION-MOLDABLE THERMOPLASTIC POLYMER COMPOSITION AND SEMI-CONDUCTIVE DEVICES FABRICATED THEREWITH," the teachings of which are incorporated by reference herein, as if reproduced in full hereinbelow.

This invention relates generally to thermoplastic polymer compositions, especially thermoplastic polymer compositions that are optically clear, thermally-stable, ultraviolet light-resistant, melt-processable and injection-moldable and the use of such compositions in fabricating a semi-conductive device, particularly the use of such compositions to encapsulate a light emitting diode (LED). This invention relates more particularly to such thermoplastic compositions wherein the compositions comprise a hydrogenated vinyl aromatic/conjugated diene block copolymer, especially a hydrogenated styrene/butadiene block copolymer that has a glass transition temperature ($T_g$) of at least ($\geq$) 138° centigrade (° C.), flows into a molding cavity without substantially damaging a semi-conductive device or a component thereof, hardens or sets far more rapidly than a thermoset composition such as an epoxy resin composition and resists deformation once set or hardened and then exposed to solder reflow conditions (e.g. a peak temperature of 250° C. for a period of 10 seconds (sec)).

A LED is a semiconductor diode that consumes little energy (e.g. a voltage of less than (<) 5 volts or a current of <20 milliamperes (mamps)) yet emits light with a brightness exceeding that of a much larger incandescent bulb. These characteristics contribute, at least in part, to rising popularity of LED use in various display, sign/indicator and lighting applications.

A LED, whether a lamp type or a surface mount device (SMD) type, typically comprises a LED chip that is encapsulated by an optically clear and thermally stable material into a device for proper wiring, mounting and functioning. Materials currently used to encapsulate the LED chip include, for example, epoxy resins and silicones. Neither class of encapsulating material represents an optimal solution. For example, epoxy resins tend to exhibit poor light stability in that they yellow over time following exposure to ultraviolet (UV) light or to elevated thermal conditions (e.g. a temperature in excess of (>) 110° C. for a time >1000 hours). Yellowing, in turn, leads to a reduction in light output from a LED over time. Epoxy resins fall in a generic class of thermoset resins and require curing before they are useful in, for example, a LED. Curing often occurs by way of a multi-step process over an extended period of time (e.g. three hours) in order to minimize residual stress within an aliquot of cured epoxy resin. "Residual Stress" refers to a tension or compression that exists in a bulk material without application of an external load such as an applied force or displacement of thermal gradient. As residual stress within a LED material increases, adverse effects such as dimensional changes or cracking tend to occur over a LED's lifetime usage. Extended curing times, especially in conjunction with a multi-step curing process, lead to undesirably low production rates and, in some instances, an uneven external surface for an encapsulated LED. Silicones (sometimes called "silicone materials") have much better light stability (reduced yellowness). In addition, changes in molecular design allow production of both soft elastomeric silicone bodies and hard or plastic silicone bodies. In either event, one conventionally uses a liquid form of silicone and an extended curing time (e.g. more than several hours) to make the hard or soft silicone bodies. The liquid form normally leads to use of special techniques such as potting or casting to make a silicone body as well as extended curing times (e.g. more than several hours). The extended curing times may, in turn, lead to lack of surface uniformity (possibly due to sagging) and less than desirable dimensional uniformity, either of which normally requires rejection of an undesirably high fraction of encapsulated LEDs made using such silicone materials. Defects such as lack of surface uniformity and lack of dimensional consistency translate to low optical quality in resulting encapsulated LEDs.

U.S. Pat. No. 6,815,475 to Donald et al. teaches that compositions comprising a hydrogenated block copolymer can be used in a variety of applications including films, profiles, sheets, pultruded articles, fibers, coated articles, injection molded articles and blow or rotational molded articles. The compositions comprise a fully or substantially fully hydrogenated, rigid block copolymer that has at least two distinct blocks of hydrogenated, polymerized vinyl aromatic monomer and one block of hydrogenated, polymerized conjugated diene monomer. The block copolymer may be any of a triblock, a multiblock (including pentablock), a tapered block, and a star block configuration. Donald et al. discloses a number of injection molded articles at column 29, lines 29-49 and suggests a reference related to well known injection molding methods at column 29, lines 50-53. See also U.S. Pat. No. 6,632,890 to Bates et al.

Japanese Patent Application Publication (JPAP) Kokai 2001-203397 to Nishijima discloses a LED in which a semiconductor chip mounted on a metal lead frame is encapsulated with a thermoplastic resin that contains a specific cyclic hydrocarbon polymer selected from five groups of polymers.

U.S. Pat. No. 6,149,304 to Centofante relates to a method and apparatus for encapsulating one or more small electronic devices such as a LED with a thermoplastic encapsulating material and establishing a mechanical bond to a printed circuit board or portion thereof.

JPAP 2004-294842 to Hiroyuki et al. teaches formation of a LED lamp lens by injection molding a cyclic olefin group thermoplastic resin.

U.S. Pat. No. 4,514,588 to Beever et al. discloses encapsulation of electronic components with a poly(arylene sulfide) composition that contains a hydrogenated conjugated diene/monovinyl-substituted aromatic copolymer.

Japanese Patent Publication (JP) 2000-123577 teaches manufacture of a semiconductor device such as a LED by encapsulating the semiconductor device with a thermoplastic resin, then coating external surfaces of the thermoplastic resin with a thermosetting resin, and then curing the thermosetting resin with activated energy rays.

U.S. Pat. No. 5,352,744 to Bates et al. relates to a method for hydrogenating poly(alkenyl aromatic) polymers or poly(alkenyl aromatic)/polydiene block copolymers that provides hydrogenated polymers with 99.5% or greater saturation.

In some embodiments, this invention is a melt-processable polymer composition comprising a thermoplastic, substantially fully hydrogenated vinyl aromatic block copolymer, the substantially fully hydrogenated block copolymer having a) a glass transition temperature of $\geq$138° centigrade (° C.), b) a shear viscosity at an oscillatory shear frequency of 0.025 radians per second (rad/s or rad/sec) and a temperature of 260° centigrade of $\geq$2×10$^5$ pascal-seconds, preferably $\geq$2.0×10$^5$ pascal-seconds (Pa-s), c) a viscosity at a temperature of 260° C. and an apparent shear rate of 100 reciprocal seconds ($s^{-1}$ or $sec^{-1}$) of no more than ($\leqq$) 1000 Pa-s, d) a polymerized vinyl aromatic content, prior to hydrogenation, within a range of from 60 percent by weight (wt %) to 80 wt %, each wt % being based upon total block copolymer weight prior to hydrogenation, and e) a weight average molecular weight (Mw), prior to hydrogenation, within a range of from 40,000 grams per mole (g/M) to 150,000 g/M.

In other embodiments, this invention is an encapsulated LED comprising a semiconductor diode and an encapsulating amount of the melt-processable polymer composition noted above in the immediately preceding paragraph, the diode being mounted on a metal lead frame and encapsulated with the melt-processable polymer composition.

In still other embodiments, this invention is an illumination device (e.g. a lamp, an indicator or a backlight display) that comprises $\geqq$one encapsulated LED.

In yet other embodiments, this invention is an electronic device (e.g. a sensor, a remote control, or a touch screen) that comprises $\geqq$one encapsulated LED.

In again other embodiments, this invention is a lighting display device that comprises $\geqq$one encapsulated LED.

Skilled artisans readily understand that an illumination device or an electronic device comprises standard features or parts (e.g. any one or more of a housing, mounting platform, or reflector) as well as a means of effecting an electronic pathway between a source of electric current and an encapsulated LED.

When ranges are stated herein, as in a range of from 2 to 10, both end points of the range (e.g. 2 and 10) and each numerical value, whether such value is a rational number or an irrational number, are included within the range unless otherwise specifically excluded.

Expressions of temperature may be in terms either of degrees Fahrenheit (° F.) together with its equivalent in ° C. or, more typically, simply in ° C.

Unless stated to the contrary, implicit from the context, or customary in the art, all parts and percents are based on weight.

This invention relates to a composition of matter suitable for use as an encapsulation or over-molding material in preparing encapsulated LEDs as well as resulting encapsulated LEDs. The composition of matter is a thermoplastic material based on a hydrogenated vinyl aromatic-conjugated diene block copolymer, preferably a substantially fully hydrogenated (hydrogenation of >95 percent (%) of conjugated diene double bonds and >90% of vinyl aromatic double bonds) vinyl aromatic-conjugated diene block copolymer, and more preferably a fully hydrogenated (hydrogenation of >99% of both conjugated diene double bonds and vinyl aromatic double bonds) vinyl aromatic-conjugated diene block copolymer. The composition of matter, being a thermoplastic material, can be directly over-molded onto a LED chip, especially a LED chip mounted on a frame, by injection molding. The resulting encapsulated LED shows much better light stability (less yellowing following exposure to ultraviolet radiation) than encapsulated LEDs prepared using a thermoset epoxy resin and improved dimensional stability (maintenance of height and width or resistance to collapse) under solder reflow process conditions than thermoplastic polymers (e.g. cyclic olefin polymers and cyclic olefin copolymers) sometimes used in optical applications. The composition of matter lends itself to polymer melt processing techniques, especially injection molding. Injection molding of thermoplastic materials provides a cycle time that is much shorter than that required for thermoset materials, such as epoxy and silicone, which typically require an extended cure time of from several minutes to several hours. A shorter cycle time leads, in turn, to an increased production rate.

The hydrogenated vinyl aromatic-conjugated diene block copolymers noted above preferably have a combination of three properties: a) a $T_g$ of $\geqq$138° C., b) a viscosity at an oscillatory shear frequency of 0.025 radians per second (rad/s) and a temperature of 260° C. (sometimes referred to as "$\eta^*$") of $\geqq$200,000 ($2 \times 10^5$, or more preferably $2.0 \times 10^5$) pascal seconds (Pa-s), and c) a viscosity (at an apparent shear rate of 100 reciprocal seconds ($s^{-1}$) (sometimes referred to as "$\eta$") and a temperature of 260° C. of $\leqq$1,000 Pa-s ($1 \times 10^3$) Pa-s. The hydrogenated vinyl aromatic-conjugated diene block copolymers noted above more preferably have three additional properties: d) a triblock architecture, preferably a triblock architecture based on a polymerized or pre-hydrogenated polymer with two vinyl aromatic blocks, especially styrene blocks, and one conjugated diene block, especially a butadiene block, e) a pre-hydrogenation vinyl aromatic content, more preferably a pre-hydrogenation styrene content, within a range of from 60 wt % to 80 wt %, more preferably from 65 wt % to 80 wt %, and still more preferably from 70 wt % to 80 wt %, each wt % being based upon total pre hydrogenation triblock copolymer weight, and f) a Mw, prior to hydrogenation, of $\geqq$40,000 g/M, more preferably $\geqq$50,000 g/M and still more preferably $\geqq$60,000 g/M, and $\leqq$150,000 g/M, more preferably $\leqq$120.000 g/M, still more preferably $\leqq$100,000 g/M and even more preferably $\leqq$90,000 g/M.

The vinyl aromatic block copolymer, prior to hydrogenation, preferably has polymerized therein $\geqq$one block comprising a conjugated diene and $\geqq$two blocks comprising a vinyl aromatic monomer (e.g. a styrenic monomer such as styrene, alpha-methyl styrene or a mixture thereof). The vinyl aromatic block copolymer is more preferably a styrene-butadiene-styrene triblock copolymer.

The compositions of matter may also comprise one or more additives. One class of additives, generically labeled as "phosphor additives", effectively converts short wavelength light (e.g. blue light) into longer wavelength light (e.g. yellow light), thereby allowing one to change color of an encapsulated LED. An example of a phosphor additive is cerium-doped yttrium aluminum garnet ($Ce^{+3}$:YAG), Skilled artisans understand that one may incorporate at least one commercially available phosphor additive into the above compositions of matter in order to manufacture a white light encapsulated LED or an encapsulated LED that has a desirable color other than blue or white. If desired, one can apply a coating to an encapsulated LED to alter its color rather than incorporating a phosphor additive. A second class of additives, nominally "stabilizing additives", includes anti-oxidants such as hindered phenols (e.g., Irganox™ 1010, and Irganox™ 1076, both commercially available from Ciba) and phosphates (e.g., Irgafos™ 168, commercially available from Ciba, and Doverphos™ 9228, commercially available from Dover Chemical), ultraviolet (UV) light stabilizers such as hindered amines (e.g., Chimassorb™ 944, commercially available from Ciba, and Cyasorb™ 3529, commercially available from Cytec Industries) and benzotriazole (e.g., Tinuvin™ 234, commercially available from Ciba), mold release agent (e.g., glycolmonostearate, or poly(nonyl phenyl ether)), and antistatic agents such as an ethoxylated alkylamine, an ethoxylated lauramide, or glycerol monostearate. Any stabilizing additive conventionally used in conjunction with thermoplastic polymer resins may be used in the above compositions of matter as long as it does not interfere, either because of effect or because of amount, with properties desired for the above compositions of matter. An optional third group of additives includes cross-linking agents, especially cross-linking agents that effect cross-linking between hydrogenated diene block segments of two different block copolymer molecules. The cross-linking agents preferably activate after the above compositions of matter are converted to a shaped article via a process such as injection molding. The amount of cross-linking agent, when used, preferably falls within a range of from 10 wt % to 0.1 wt %, more preferably within a range of from 5 wt % to 0.2 wt %, each wt % being based upon total composition of matter weight. The compositions of matter optionally include one or more other additives such as a processing aid, a colorant or pigment, an extender, or another polymer. The shaped article may also be coated with at least one layer or top coat that imparts a property such as scratch resistance or anti-reflectivity.

The encapsulated LED of some embodiments of this invention, preferably has a desirable level of ultraviolet light resistance as evidenced by a >70% retention of its original light transmittance at a wavelength within a range from 350 nm to 450 nm following a 1000 hour QUV-A exposure in accordance with American Society for Testing and Materials (ASTM) Test G154. In these and other embodiments, the encapsulated LED more preferably has a light transmittance of ≧80% at a wavelength of 400 nm following exposure to a temperature of 110° C. for a period of 1000 hours. In these and other embodiments, the encapsulated LED still more preferably has a change in transparency after exposure to a temperature of 85° centigrade and a relative humidity of 85 percent for 1000 hours of <10% relative to transparency of the encapsulated LED prior to such exposure. In these and other embodiments, the encapsulated LED even more preferably has a change in yellowness index, following exposure to a temperature of 110° centigrade for 1000 hours of <2.0 relative to yellowness index of the encapsulated LED prior to such exposure. In these and other embodiments, the encapsulated LED yet more preferably has ≧one of, and most preferably both of, a change in diameter of <five (5) percent (<5%) and a change in height of <5% after a single pass through an infrared reflow oven during which the LED has an exposure to a peak temperature that is ≧250° C., but <265° C., of ≦fifteen seconds at a temperature within 5° C. of the peak temperature.

Examples (Ex) of the present invention are designated by Arabic numerals and Comparative Examples (Comp Ex or Cox) are designated by capital alphabetic letters. Unless otherwise stated herein, "room temperature" and "ambient temperature" are nominally 25° C.

Prepare injection molded LED sample materials using a mold for over-molding and encapsulation as shown in FIG. 1, a 150 ton injection molding machine (Haw Chin-HC-120L), a melt temperature of 230° C., 250° C. or 270° C., as shown in Table 2 below, an ambient temperature (nominally 25° C. prior to any injection molding) mold condition, and a cooling cycle of approximately four seconds duration. Vacuum-dry compositions of matter at a temperature of 85° C. for a period of four hours before converting them to injection molded LED samples. The samples have an encapsulated portion with a nominal outer diameter of 4.9 millimeters (mm) (0.193 inch (in)) and a nominal height of 8.6 mm (0.339 in).

Determine $T_g$ of hydrogenated vinyl aromatic block copolymers by dynamic mechanical analysis using a rheometer (e.g., ARES rheometer manufactured by TA Instruments). Define Tg by its tan δ peak measured from a solid state temperature ramp of linear viscoelastic spectrum data (storage modulus G', loss modulus G" and tan δ=G"/G') between room temperature and 160° C. at a temperature ramp rate of 3° C./min and an oscillatory frequency of 1 radian per second (rad/s). Use a solid rectangular shaped specimen of approximate 45 millimeter (mm) length, 12.5 mm width and 3.2 mm thickness for testing. Compression mold test specimens at a temperature of 250° C. and a pressure of approximately 500 pounds per square inch (psi) (3447 kilopascals (KPa) using a standard compression molder (e.g., Tetrahedron™ 1401 from Tetrahedron Associates Inc., San Diego, Calif.).

Measure Tg of several commercially available cyclic olefin polymer (COP) and cyclic olefin copolymer by Differential Scanning calorimetry (DSC) at a scan rate of 10° C./min and report values using a second heat scan.

Use a parallel plate rheometer (e.g., ARES rheometer manufactured by TA Instruments) to measure complex shear viscosity ($\eta^*$) at an oscillatory frequency of 0.025 rad/s and temperature of 260° C. Use a compression molded disk of 25 mm diameter and approximate 2 mm thickness for measurement of complex shear viscosity $\eta^*$. Experimental procedures for how to measure complex shear viscosity are well known in the art and can be found in a monogragh such as *Rheology: Principles, Measurements, and Applications*, by Christopher W. Macosko (VCH, 1994).

Use a capillary rheometer such as a Rheograph™ 2003, commercially available from Gottfert, to measure apparent shear viscosity ($\eta$) at an apparent shear rate of 100 s$^{-1}$ and a melt temperature of 260° C. with a capillary die with a length of 20 millimeters (mm) and a diameter of one (1) mm, to measure shear viscosity ($\eta$).

Conduct molecular weight analysis of a hydrogenated vinyl aromatic-conjugated diene block copolymer by subjecting the block copolymer, prior to its hydrogenation, to gel permeation chromatography (GPC) using tetrahydrofuran (THF) as a solvent for the block copolymer. Calibrate GPC columns using narrow molecular weight polystyrene standards from Polymer Labs, Inc. The molecular weight of the standards ranges from 580 g/M to 3,900,000 g/M. Prepare six standard cocktails that have three or four standards per cocktail, each standard in the cocktail differing in molecular weight from others in the cocktail by a factor of approximately ten. Determine peak elution volume of each standard and generate a column calibration of molecular weight versus elution volume by fitting the narrow standard data with a 5th order polynomial fit. Report Mn or weight average molecular weight ($M_w$) of pre-hydrogenated block copolymers as polystyrene-equivalent values.

Perform molecular weight analysis of fully hydrogenated vinyl aromatic-conjugated diene block copolymer, post hydrogenation, using a high temperature GPC instrument (Polymer Laboratories, Inc. model PL210) equipped with a differential refractive index detector (PL210 DRI), a viscometer (Viscotek™ model PL210-R) and a dual angle laser light scattering detector (Precision Detectors, Inc. model PD2020). Use Polymer Laboratories Plgel Olexis columns to perform the GPC separation. Calibrate the columns using narrow molecular weight distribution polystyrene standards (Polymer Laboratories, Inc.). Operate the instrument at a set point temperature of 145° C. and use. Use 1,2,4-trichlorobeneze, stabilized with approximately 100 parts by weight per million parts by weight of 1,2,4-trichlorobenzene (ppm) of 2,6-di-tert-butyl-4-methylphenol, as a carrier solvent. Prepare samples in 1,2,4-trichlorobenzene (stabilized with 200 ppm 2,6-di-tert-butyl-4-methylphenol) at a concentration of 1.0 mg/mL. Dissolve the samples by heating in an oven operating at a set point temperature of 160° C. for one hour. Agitate sample bottles by hand every 20 minutes. Once dissolved, transfer a 1.8 mL aliquot of sample solution by a hot glass pipette to an injection vial for the PL210 system. Fill two injections vials from each sample bottle. Make an injection of 200 microliters (μL) from each vial onto the chromatographic system. Report number average (Mn) or weight average molecular weight ($M_w$) of hydrogenated block copolymers (post-hydrogenation) as polystyrene-equivalent values.

Subject the injection molded LED sample materials to solder reflow testing, by placing a sample on a silicone wafer surface, and passing the silicone wafer and sample(s) one time through an infrared (IR) reflow oven (Sikama™ Reflow Oven Curing System, Sikama International Inc., Santa Barbara, Calif.) on a conveyor belt that moves at a speed of 15 inches per minute (in/min). Temperature within the oven begins at a set point temperature of 100° C. and gradually climbs to a peak temperature of either 265° C., 250° C. or 235° C., and then cools down to 120° C., at a rate of less than 5° C./sec before the wafer and sample(s) exit(s) the reflow oven. The choice of peak temperature depends on the type of solder. The maximum time exposure for an encapsulated LED within 5° C. of actual peak temperature is within a range of from 10 seconds to 15 seconds.

Measure an injection molded LED sample before and after passage through the IR reflow oven. Calculate % dimensional change according to using formulae as follows:

$$\Delta D = \frac{D - D_0}{D_0} \times 100\%$$

$$\Delta H = \frac{H - H_0}{H_0} \times 100\%$$

where, D represents diameter of an encapsulated portion of a cylindrical injection-molded LED sample and H represents height of that portion of the LED sample; $D_0$ and $H_0$ represent, respectively, the diameter and height of injection molded LED sample prior to IR reflow oven testing. $D_0$ is approximately 4.9 millimeters (mm) and $H_0$ is approximately 8.6 mm for each cavity of the mold shown in FIG. 1. Use three dimensional (3-D) optical analysis to obtain dimensional measurements of LED samples. A desire for increased dimensional stability favors minimizing one or both, preferably both of ΔD and ΔH. The injection molded LED sample materials preferably have both a ΔD and a ΔH that is preferably <5%, more preferably <3% and still more preferably <2%. Skilled artisans consider testing of the injection molded LED sample materials to be a success if ≧75%, more preferably ≧80% and still more preferably >85% of the samples passes testing.

Connect injection molded LED samples to a source of current. If the sample lights, it passes. If it does not, the sample fails.

Prepare rectangular pieces having a thickness of 3 mm from each candidate composition of matter and subject the pieces to two different environmental durability tests. In one test, evaluate transparency and yellowness of rectangular pieces of candidate compositions of matter using before and after exposure of such pieces to a temperature of 85° C. and a relative humidity of 85% for a period of 1000 hours. In a second test, evaluate transparency and yellowness of rectangular pieces of candidate materials before and after exposure of such pieces to a temperature of 110° C. for a period of 1000 hours. Measure transparency (or transmittance) of specimens at 400 nanometer (nm) wavelength using a UV-Vis spectrometer. Measure yellowness index (YI) using a colorimeter.

Determine UV resistance of an injection molded LED sample, in accord with ASTM G-154 (QUV-A Method) by subjecting 20 LED samples prepared from each candidate composition of matter to UV irradiation in an UV chamber equipped with four UV fluorescent lamps (wavelength of 340 nm, 40 watts) for a period of 1,000 hours. UV-degradation of encapsulation material can result in potential failures of LED function or the reduction of lighting output (e.g., due to yellowing of encapsulants).

Ex 1 through Ex 8 and CEx A through CEx S

Prepare test samples using procedures detailed above from several candidate materials, subject the samples to testing for Tg, η* and η using procedures detailed hereinabove, and summarize test results in Table 1 below. Materials A-1 through A-6 are developmental hydrogenated styrene-butadiene block copolymers prepared by The Dow Chemical Company.

A-1 is a triblock copolymer with a pre-hydrogenation styrene content of 75 wt %, a pre-hydrogenation number average molecular weight (Mn) of 60,000 g/M, a pre-hydrogenation weight average molecular weight (Mw) of 70,600 g/M, a pre-hydrogenation 1,2-butadiene content of 10 wt %, a post-hydrogenation number average molecular weight (Mn) of 59,050 g/M, and a post-hydrogenation weight average molecular weight (Mw) of 64,600.

A-2 is a triblock copolymer that has a pre-hydrogenation styrene content of 75 wt %, a pre-hydrogenation Mn of 62,000 g/M, a pre-hydrogenation Mw of 69,200 g/M a pre-hydrogenation 1,2-butadiene content of 10 wt %, a post-hydrogenation number average molecular weight (Mn) of 59,100 g/M, and a post-hydrogenation weight average molecular weight (Mw) of 65,300.

A-3 is a triblock copolymer that has a pre-hydrogenation styrene content of 75 wt %, a pre-hydrogenation Mn of 70,000 g/M, a pre-hydrogenation Mw of 72,000 g/M, a pre-hydrogenation 1,2-butadiene content of 10 wt %, a post-hydrogenation number average molecular weight (Mn) of 61,900 g/M, and a post-hydrogenation weight average molecular weight (Mw) of 67,600.

A-4 is a triblock copolymer that has a styrene content of 60 wt %, a pre-hydrogenation Mn of 50,000 g/M and a 1,2-butadiene content of 10 wt %.

A-5 is a pentablock copolymer that has a styrene content of 85 wt %, a pre-hydrogenation number average molecular weight (Mn) of 60,000 g/M and a 1,2-butadiene content of 10 wt %.

A-6 is a pentablock copolymer that has a styrene content of 90 wt %, a pre-hydrogenation Mn of 60,000 g/M and a 1,2-butadiene content of 10 wt %.

B-1 and B-2 are random, cyclic olefin copolymers commercially available from Ticona under the respective trade designations of TOPAS™ 6015 and TOPAS™ 6017.

C is a cyclic olefin polymer commercially available from Zeon Chemical under the trade designation ZEONEX™ E48R.

D is an epoxy resin commercially available from The Dow Chemical Company under the trade designation D.E.R. 331.

TABLE 1

| Material | Tg (° C.) | η* (Pa-s) | η (Pa-s) |
|---|---|---|---|
| A-1 | 141 | 3.8 × 10⁵ | 495 |
| A-2 | 141 | 4.6 × 10⁵ | 520 |
| A-3 | 141 | 4.7 × 10⁵ | 556 |
| A-4 | 135 | 1.6 × 10⁵ | 208 |
| A-5 | 133 | 1.2 × 10² | 128 |
| A-6 | 134 | 1.1 × 10² | 147 |
| B-1 | 155 | 1.9 × 10³ | 1154 |
| B-2 | 175 | 5.9 × 10³ | ** |

TABLE 1-continued

| Material | Tg (° C.) | η* (Pa-s) | η (Pa-s) |
|---|---|---|---|
| C | 140 | $1.7 \times 10^3$ | 892 |
| D | n/a | Nm | nm |

In Table 1, n/a means not applicable; nm means not measured, and ** means viscosity sufficiently high to overload the test instrument.

Prepare injection molded LED test samples using procedures as detailed above at processing temperatures as shown in Table 2 below. Subject the samples to dimensional stability testing using solder reflow testing procedures with a peak temperature in the reflow oven of 265° C. and calculate of ΔD and ΔH using formulae shown above, reporting average values of ΔD and ΔH, using at least three LED test samples to calculate each average, and summarize test results also in Table 2 below.

TABLE 2

| Ex/CEx | Resin | Processing Temperature (° C.) | Yield (%) | ΔD (%) | ΔH (%) | Comments |
|---|---|---|---|---|---|---|
| 1 | A-1 | 250 | 93 | 0.94 | −0.65 | |
| 2 | A-2 | 250 | 88 | 2.63 | −0.95 | |
| 3 | A-3 | 250 | 90 | 3.17 | −1.12 | |
| 4 | A-2 | 270 | 88 | nm | Nm | |
| 5 | A-3 | 270 | 93 | nm | Nm | |
| A | A-1 | 230 | 40 | nm | Nm | Low yield |
| B | A-2 | 230 | 67 | nm | Nm | Low yield |
| C | A-3 | 230 | 20 | nm | Nm | Low yield |
| D | A-4 | 250 | nm | + | + | Fails IR Reflow |
| E | A-5 | 250 | nm | + | + | Fails IR Reflow |
| F | A-6 | 250 | nm | + | + | Fails IR Reflow |
| G | B-1 | 250 | 0 | nm | Nm | Fails IR Reflow |
| H | B-2 | 250 | 30 | nm | Nm | Fails IR Reflow |
| I | C | 250 | 23 | nm | Nm | Fails IR Reflow |
| J | B-1 | 270 | 38 | + | + | Fails IR Reflow |
| K | B-2 | 270 | 12 | + | + | Fails IR Reflow |
| L | C | 270 | 71 | + | + | Fails IR Reflow |
| M | D | n/a | n/a | −0.06 | −0.38 | |

In Table 2, "nm" means not measured, "n/a" means not applicable, and "+" means that LED test samples melt and collapse during or as a result of solder reflow testing.

Replicate Ex 1 thorough Ex 3 and CEx D through CEx I for, respectively, Ex 6 through Ex 8 and CEx M through CEx S, but with a peak temperature in the reflow oven of either 235° C. or 250° C. and resin choices as shown in Table 3 below. Summarize test results in Table 3 below.

TABLE 3

| Ex/CEx | Resin | Peak Temperature of Solder Reflow Oven (° C.) | ΔD (%) | ΔH (%) | Comments |
|---|---|---|---|---|---|
| 6 | A-1 | 250 | 1.71 | −0.76 | |
| 7 | A-2 | 250 | 1.81 | −0.63 | |
| 8 | A-3 | 250 | 1.77 | −1.07 | |
| N | B-1 | 250 | 16.15 | 0.08 | Fails IR Reflow |
| O | B-2 | 250 | 6.61 | 0.40 | Fails IR Reflow |
| P | C | 250 | + | + | Fails IR Reflow |
| Q | B-1 | 235 | 8.04 | −1.23 | Fails IR Reflow |
| R | B-2 | 235 | 1.41 | 1.35 | |
| S | C | 235 | nm | nm | Fails IR Reflow |

In Table 3, "nm" means not measured, and "+" means that LED test samples melt and collapse during or as a result of solder reflow testing.

Subject rectangular pieces or bars, prepared as detailed above, of A-1 and D and subject the bars to transparency and yellowness testing, also as detailed above. Summarize transparency test results in Table 4 below and yellowness test results in Table 5 below.

TABLE 4

| | Days | | | | | | | |
|---|---|---|---|---|---|---|---|---|
| Material | 0 | 1 | 2 | 4 | 8 | 10 | 20 | 40 |
| D | 80.39 | 81.64 | 81.76 | 78.60 | 77.04 | 77.11 | 74.40 | 63.06 |
| A-1 | 86.43 | 85.41 | 85.45 | 85.67 | 86.33 | 84.10 | 86.00 | 86.09 |

TABLE 5

| | Days | | | | | | | |
|---|---|---|---|---|---|---|---|---|
| Material | 0 | 1 | 2 | 4 | 8 | 10 | 20 | 40 |
| D | 2.55 | 1.94 | 2.32 | 3.08 | 3.69 | 4.19 | 5.22 | 9.29 |
| A-1 | 1.78 | 1.95 | 2.02 | 2.18 | 2.34 | 2.45 | 2.74 | 2.80 |

The hydrogenated block copolymer representative of the present invention (A-1) substantially maintains, as shown in Table 4, its original transparency and color over 1,000 hours of exposure. Conversely, an epoxy resin (D) loses a substantial fraction of its transparency over the same 1000 hour period. As shown in Table 5, the hydrogenated block copolymer A-1 undergoes very little change in yellowness over 1000 hours whereas epoxy D undergoes more than a three-fold increase in yellowness over the same period of time.

Subject injection molded samples of an encapsulated LED to UV resistance testing as detailed above, using twenty samples prepared from A-1, a commercial alicyclic epoxy-based encapsulant (formerly available from The Dow Chemical Company under the trade designation E.R.L. 4221, an alicyclic epoxy) and D. A sample fails when its yellowness index changes by a magnitude of at least two (2) relative to yellowness index of the same material prior to UV resistance testing or a reduction in luminance of at least 30% over a wavelength of 350 nm to 450 nm. Summarize test results in Table 6 below in terms of number of samples that fail/total number of samples tested (20 in each instance).

TABLE 6

| Test Duration (hours) | D | Commercial Epoxy | A-1 |
|---|---|---|---|
| 0 | 0/20 | 0/20 | 0/20 |
| 168 | 5/20 | 2/20 | 0/20 |
| 336 | 20/20 | 10/20 | 0/20 |
| 500 | | 20/20 | 0/20 |
| 1000 | | | 0/20 |

The data in Tables 2 through 6 illustrate several points. First, despite their relatively high Tg, as compared to Resins A-1 through A-3, Resins B-1, B-2 and C fail to provide adequate dimensional stability during solder reflow testing, particularly when the peak temperature of solder reflow oven needs to be at least 250° C., something required by nearly all current LED manufacturers during their lead free soldering process. Second, hydrogenated block copolymers representative of the present invention ($T_g$ of at least 138° C., η* of at least $2\times10^5$ Pa-s, preferably at least $2.0\times10^5$ Pa-s, and η of less than 1000 Pa-s), as exemplified by A-1, A-2 and A-3 pass all of the physical property tests to which they are subjected and do so with a reasonable yield (more than 80%) when used to prepare encapsulated LEDs at a temperature of 250° C. or 270° C. Third, a hydrogenated block copolymer representative of the present invention (A-1) retains desirable levels of transparency and resists yellowing whereas a thermoset epoxy resin encapsulant loses a significant fraction of its transparency and undergoes significant yellowing under the same UV test conditions. Similar results should follow with other hydrogenated block copolymers that represent various aspects of this invention.

What is claimed is:

1. A melt-processable polymer composition comprising a thermoplastic, substantially fully hydrogenated vinyl aromatic block copolymer, the substantially fully hydrogenated block copolymer having a) a glass transition temperature of at least 138° centigrade, b) a complex shear viscosity at an oscillatory frequency of 0.025 radians per second and a temperature of 260° centigrade of at least $2\times10^5$ pascal-seconds, c) a viscosity at a temperature of 260° centigrade and an apparent shear rate of 100 reciprocal seconds of no more than 1000 pascal-seconds, d) a polymerized vinyl aromatic content, prior to hydrogenation, within a range of from sixty percent by weight to eighty percent by weight, each weight percent being based upon total block copolymer weight prior to hydrogenation, and e) a weight average molecular weight, prior to hydrogenation, within a range of from 40,000 grams per mole to 150,000 grams per mole.

2. The melt-processible polymer composition of claim 1, wherein the vinyl aromatic block copolymer, prior to hydrogenation, has polymerized therein at least one block comprising a conjugated diene and at least two blocks comprising a vinyl aromatic monomer.

3. The melt-processible polymer composition of claim 2, wherein the vinyl aromatic block copolymer, prior to hydrogenation, is a styrene-butadiene-styrene triblock copolymer.

4. An encapsulated light emitting diode comprising a semiconductor diode and an encapsulating amount of the melt-processible polymer composition of claim 1, the diode being mounted on a metal lead frame and encapsulated with the melt-processible polymer composition.

5. The encapsulated light emitting diode of claim 4, wherein the encapsulated light emitting diode has at least one of a) a ultraviolet light resistance as evidenced by a more than 70 percent retention of its original light transmittance at a wavelength within a range of from 350 nanometers to 450 nanometers following a 1000 hour QUV-A exposure in accordance with American Society for Testing and Materials (ASTM) Test G154; b) a light transmittance of at least 80 percent at a wavelength of 400 nanometers following exposure to a temperature of 110° C. for a period of 1000 hours; c) a change in transparency after exposure to a temperature of 85° centigrade and a relative humidity of 85 percent for 1000 hours of less than 10 percent relative to transparency of the encapsulated light emitting diode prior to such exposure; d) a change in yellowness index, following exposure to a temperature of 110° centigrade for 1000 hours of less than 2.0 relative to yellowness index of the encapsulated light emitting diode prior to such exposure; and e) as at least one of a change in diameter of less than 5 percent and a change in height of less than 5 percent after a single pass through an infrared reflow oven during which the light emitting diode has an exposure to a peak temperature that is greater than or equal to 250° centigrade, but less than 265° centigrade, of no more than fifteen seconds at a temperature within 5° centigrade of the peak temperature.

6. An illumination device, an electronic device or a light display device comprising at least one encapsulated light emitting diode of claim 5.

* * * * *